United States Patent [19]

Sannohe et al.

[11] Patent Number: 4,888,216

[45] Date of Patent: Dec. 19, 1989

[54] COPPER POWDER FOR ELECTROCONDUCTIVE PAINTS AND PROCESS FOR PRODUCTION THEREOF

[75] Inventors: Kanetaro Sannohe; Hirohisa Senzaki; Yoshio Sohama, all of Takehara, Japan

[73] Assignee: Mitsui Kinzoku Kogyo Kabushiki Kaisha, Tokyo, Japan

[21] Appl. No.: 329,354

[22] Filed: Mar. 27, 1989

Related U.S. Application Data

[62] Division of Ser. No. 141,416, Jan. 7, 1988, Pat. No. 4,833,033.

[30] Foreign Application Priority Data

Oct. 20, 1987 [JP] Japan ............................ 62-264952

[51] Int. Cl.$^4$ .............................................. B05D 7/00
[52] U.S. Cl. ................................. 427/216; 252/520; 427/221
[58] Field of Search ............... 252/518, 520; 427/216, 427/221; 428/403, 407

[56] References Cited

U.S. PATENT DOCUMENTS

| | | | |
|---|---|---|---|
| 3,905,936 | 9/1975 | Hawthorne | 427/216 X |
| 4,310,598 | 1/1982 | Takami et al. | 106/483 X |
| 4,781,980 | 11/1988 | Yoshitake et al. | 427/220 X |

Primary Examiner—Michael Lusignan
Attorney, Agent, or Firm—Stevens, Davis, Miller & Mosher

[57] ABSTRACT

A process for preparing a copper powder for electroconductive paints, which comprises adding to a dispersion bath of copper powder and a dispersion medium a mixture of a titanium acylate polymer and a higher carboxylic acid ester to form a film of the titanium acylate polymer and the higher caboxylic acid ester on the surfaces of the particles of said copper powder, and if necessary, removing the dispersion medium to obtain the copper powder for electroconductive paints. The copper powder thus obtained is coated on the surfaces of its particles with the titanium acylate polymer and the higher carboxylic acid ester.

10 Claims, 1 Drawing Sheet

COPPER POWDER FOR ELECTROCONDUCTIVE PAINTS AND PROCESS FOR PRODUCTION THEREOF

This is a division of application Ser. No. 141,416 filed January 7, 1988, now U.S. Pat. No. 4,833,033, patented May 23, 1989.

BACKGROUND OF THE INVENTION

This invention relates to copper powder for electroconductive paints, more particularly to a copper powder for electroconductive paints (hereinafter referred to as conductive paint(s) which has improved storage stability and environmental resistance and improves the adhesion of a paint film in which it is used without reduction of the conductivity of the copper powder and its shielding effect against electromagnetic waves. The invention relates also to a process for preparing the copper powder.

One of the electromagnetic wave shielding materials known heretofore for the purpose of protecting electronic equipments from disturbance or jamming by electromagnetic waves is a conductive paint in which a conductive filler such as nickel powder, silver powder, copper powder, or carbon powder is kneaded with any of various binder resins such as thermoplastic resins. Shielding against electromagnetic waves is accomplished by applying the paint on the surface of molded articles by spraying or brushing. Conductive paints of copper type are inexpensive in comparison with those of silver or nickel types and have excellent shielding effect.

However, in the conductive paints of copper type, a uniform dispersion state cannot be realized because the copper particles tend to agglomerate together in the paint, which leads to inferior storage stability. Moreover, the conductive paints of copper type tend to be easily oxidized by environmental factors such as heat and humidity, which easily cause deterioration of environmental resistance and conductivity (attenuation of shielding effect) of the copper powder. Many methods have hitherto been proposed for the purpose of solving these problems. The methods include the preparation of conductive paints by blending a binder resin and an organic titanate into copper powder (Japanese Patent Laid-Open Application No. 36553/81), the surface treatment of copper powder with a coupling agent (Japanese Patent Laid-Open Application No. 30200/85), coating of the particles of electrolytic copper powder with an organic titanate (Japanese Patent Laid-Open Application No. 174661/84), coating of the particles of copper powder with an organic aluminum (Japanese Patent Laid-Open Application No. 179671/84) and the like.

The conductive paints thus obtained with copper powder are improved to a certain extent in storage stability and environmental resistance without a decrease in the conductivity of the copper powder and its shielding effect against electromagnetic waves.

However, conductive paints obtained with copper powder in the prior art, when used by the application thereof onto a substrate or matrix, are inferior in adhesion to the substrate and do not always exhibit excellent storage and environmental resistance.

This invention has been achieved in view of the above described background. An object of this invention is to overcome the problems accompanying conventional copper powders for conductive paints and to provide a copper powder for conductive paints which has improved storage stability and environmental resistance as well as the effect of imparting good adhesion to the paint film without reduction of the conductivity of the copper powder and shielding effect with respect to electromagnetic waves. Another object is to provide a process for preparing the copper powder according to the invention.

SUMMARY OF THE INVENTION

We have conducted a variety of researches on copper powder for conductive paints. As a result, it has been found that a paint containing copper powder exhibits excellent adhesion to a substrate or matrix if the surfaces of the particles of the copper powder are coated with a mixture of a titanium acylate polymer and a higher carboxylic acid ester. The present invention has been achieved on the basis of this discovery.

In other words, the copper powder for conductive paints according to this invention is characterized in that the surfaces of its particles are coated with a titanium acylate polymer and a higher carboxylic acid ester.

In a preferred embodiment of this invention, the higher carboxylic acid ester is a fatty acid ester having 10 to 24 carbon atoms and the titanium acylate polymer has repeating units represented by the following formulae I, II and/or III:

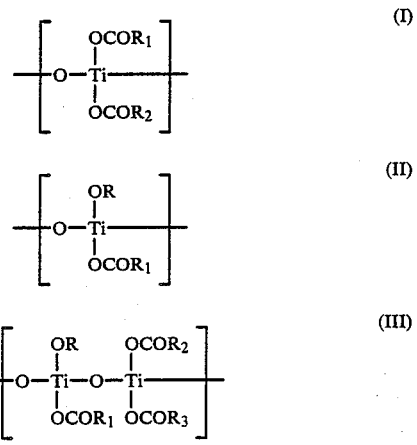

wherein: R, $R_1$, $R_2$ and $R_3$ may be the same or different and represent hydrocarbon groups having 1 to 25 carbon atoms; preferably R represents a hydrocarbon group having 1 to 5 carbon atoms; and $R_1$, $R_2$ and $R_3$ represent hydrocarbon groups having 10 to 24 carbon atoms.

The process for preparing a copper powder for conductive paints according to this invention is characterized in that a mixture of a titanium acylate polymer and a higher carboxylic acid ester is added to a dispersion bath of the copper powder and a dispersion medium to form a film of the titanium acylate polymer and the higher carboxylic acid ester on the surfaces of the particles of the copper powder, and if necessary, the dispersion medium is removed to obtain the copper powder for conductive paints.

In a preferred embodiment of this invention, the titanium acylate polymer and the higher carboxylic acid ester are mixed in a ratio of 40 to 80% by weight of the titanium acylate polymer to 60 to 20% by weight of the higher carboxylic acid ester, and the mixture of the titanium acylate polymer and the higher carboxylic acid ester is a reaction mixture of a tetraalkoxytitanium with an alkyl group having 1 to 10 carbon atoms and a higher carboxylic acid.

In a preferred embodiment of this invention, the mixture of the titanium acylate polymer and the higher carboxylic acid ester is a reaction mixture of 1 mole of a tetraalkoxytitanium and 2 to 5 moles, more preferably 3 to 4 moles of a higher carboxylic acid.

According to this invention and the preferred embodiment, the following process is conducted:

When the mixture of the titanium acylate polymer and the higher carboxylic acid ester is to be obtained from a reaction mixture of a tetraalkoxytitanium Ti(OR)$_4$ and a higher carboxylic acid R'COOH, the reaction proceeds as shown in the following reaction equations, wherein the coefficients in the equations are abbreviated:

Ti(OR)$_4$ + R'COOH ⟶

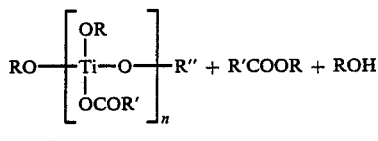

or

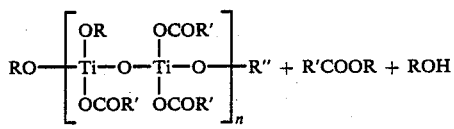

or

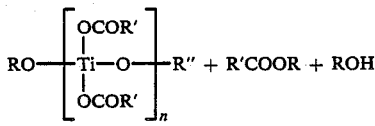

wherein: R represents an alkyl group; R" represents a hydrogen atom or a group R or COR'; and n denotes a polymerization degree.

As shown above, the tetraalkoxytitanium is first acylated by the higher carboxylic acid to form a titanium acylate dimer, and the remaining higher carboxylic acid and an alcohol formed as a by-product of acylation is reacted by the catalytic effect of the titanium compound to form a carboxylate ester. The titanium acylate dimer is condensed repeatedly to form a titanium acylate oligomer which is further polymerized to a titanium acylate polymer. Accordingly, a desirable mixture can be obtained from the reaction mixture of the tetraalkoxytitanium and the higher carboxylic acid.

In the copper powder of this invention, the surfaces of the particles of the copper powder are coated with the mixture of the titanium acylate polymer and the higher carboxylic acid ester. The hydrophobic film of the macromolecule titanium acylate polymer covers the surfaces of the particles of the copper powder, but the coverage remains insufficient, so that gaps or cracking will be formed in the film. In such a gap is formed a hydrophobic film of the carboxylic acid ester, and finally a dense film is formed on the surfaces of the particles of the copper powder. Moreover, according to this invention, a higher carboxylic acid ester is used, so that the thickness of the hydrophobic film in the direction perpendicular to the surface of the copper powder can be controlled and therefore made uniform.

Furthermore, by the application of the titanium acylate polymer and the higher carboxylic acid ester as a coating on the surfaces of the copper powder particles, a good dispersion state of the copper powder in the paint and dried paint film can be obtained, and the adhesion with respect to the substrate can be greatly improved.

When the surfaces of the particles of the copper powder are coated with the mixture of the titanium acylate polymer and the higher carboxylic acid ester, the titanium acylate polymer is hydrolyzed at the alkoxy group by the adsorption water on the surfaces of the particles of the copper powder and is bonded to and arranged on the surface of the copper powder. The carboxylic acid ester also reacts with the adsorption water on the surfaces of the copper powder particles to undergo ester exchange reaction and is bonded to and arranged on the surfaces of the copper powder particles. In this reaction, the carboxylic acid ester reacts with an alkoxy group or a terminal group in the titanium acylate polymer molecule which has been bonded to the surfaces of the copper powder particles or with an alkoxy group or a terminal group in the unreacted titanium acylate polymer molecule to suppress the condensation, whereby the thickness of the hydrophobic film in the direction perpendicular to the surface of the copper powder can be controlled and made uniform. In addition, the acylate group, a side chain of the titanium acylate polymer bonded to and arranged on the surfaces of the copper particles and the higher carboxylic acid ester of a long chain are entangled with a binder resin molecule in the paint and dry film by the van der Waals force, hydrogen bond, ionic bond, covalent bond and the like to form a good dispersion state of the copper powder, whereby uneven distribution of the copper powder is diminished, and the adhesion of the paint film to the substrate is greatly improved.

As will be confirmed by the following examples, according to the copper powder for conductive paints of this invention, it is possible to solve the difficulties of the conventional copper powder for conductive paints and to improve its storage stability and environmental resistance as well as good adhesion of a paint film containing the powder without reduction of the conductivity of the copper powder and its shielding effect against electromagnetic waves.

BRIEF DESCRIPTION OF THE ILLUSTRATIONS

FIG. 1 is an electron micrograph (×700) of a section of a dry film of a conductive paint prepared with the copper powder of this invention; and FIG. 2 is an electron micrograph (×700) of a section of a dry film of a conductive paint prepared with a copper powder which is out of the scope of this invention.

DETAILED DESCRIPTION OF THE INVENTION

COPPER POWDER

Figure 1:
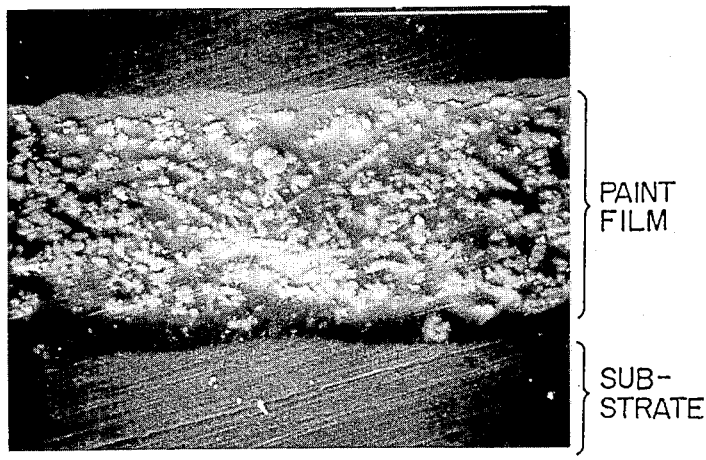

The copper powder used in this invention is in a branched shape, particle or ball shape, respectively obtained from electrolysis, reduction and atomization methods, or in the shape of flakes which is obtained by further processing the powder by the use of a ball mill or the like.

The copper powder used in this invention has a specific surface area of 1.5 $m^2/g$ or less, preferably 1.0 $m^2/g$ or less, a particle size distribution of 1 to 100 $\mu m$, preferably 1 to 50 $\mu m$, and a mean particle diameter of 3 to 30 $\mu m$, preferably 5 to 15 $\mu m$. If the specific surface area exceeds 1.5 $m^2/g$, the resistance to oxidation of copper powder will be greatly lowered. If the particle size distribution departs from the range of 1 to 100 $\mu m$ and the mean particle diameter departs from the range of 3 to 30 $\mu m$, a paint film exhibiting a uniform conductivity cannot be obtained, and the nozzle tip spraying the paint will be clogged.

It is also possible to use powders of branched shape, flakes, particles and balls blended by a V type mixer or the like.

Another copper powder which may be used in this invention is copper powder covered with silver. The amount of silver for covering is 0.1 to 20% by weight, preferably 1.0 to 5.0% by weight with respect to that of the copper component. This is because the resistance to oxidation of the copper powder is inferior with an amount of silver less than the lower limit, and the manufacturing cost will be increased if the amount exceeds the upper limit. If a copper powder covered with silver is used, a paint film having a shielding effect superior to that of a film with bare copper powder can be obtained, and thermosetting resins such as phenol resins, epoxy resins or the like as well as thermoplastic resins can also be applied as a binder resin. Examples of the method for covering the copper powder particles with silver are chemical substitution plating method, CVD method, and mechanical bonding method. Other complex copper powders which can be used in this invention other than the copper powder covered with silver include, for example, copper powders covered with metals such as nickel, zinc, palladium and platinum.

It is preferable that the copper powder be pretreated according to necessity, to remove the oxide layer from the surfaces of the copper powder particles by the use of reagents such as mineral acids, organic acids, various kinds of reducing agents or by reduction with hydrogen. Furthermore, the copper powder to be treated can be dried as a pre-treatment.

TITANIUM ACYLATE POLYMER

One of the components to cover the copper powder particles according to this invention is a titanium acylate polymer. Specifically, the polymer is a high-molecular weight compound which has the above mentioned repeating unit I, II or III alone or any combination of the repeating units I, II, and III.

The titanium acylate polymer can be obtained by reacting a tetraalkoxytitanium Ti(OR)$_4$ with a carboxylic acid, acid anhydride, inorganic acid or by reacting a tetrachlorotitanium Ti(Cl)$_4$ with ammonia/carboxylic acid, sodium carboxylate or the like.

One preferred method for synthesizing titanium acylate polymers is the method of reacting a tetraalcoxytitanium Ti(OR)$_4$ with a carboxylic acid, particularly with a higher fatty acid. In this method, by-products such as chlorides, inorganic acids or the like are not produced. In addition, the side chain of the titanium acylate polymer is acylated by the use of the higher fatty acid to make the titanium acylate polymer film more hydrophobic, and the reaction products thus obtained can be used as an agent in the production of the copper powder of this invention.

Separation and purification of the synthesized titanium acylate polymer can be carried out with techniques such as distillation, extraction, recrystallization, column chromatography and the like.

HIGHER CARBOXYLIC ACID ESTER

The higher carboxylic acid esters in this invention have long chain carbon atoms, and the preferred ones include higher fatty acid esters having 10 to 24 carbon atoms. Specific examples of such carboxylic acid esters are esters of higher saturated fatty acids such as stearic acid esters, palmitic acid esters, myristic acid esters, lauric acid esters, and capric acid esters, and isomers thereof and esters of higher unsaturated fatty acids such as oleic acid esters, linolic acid esters, and linoleic acid esters, and isomers thereof. If a lower carboxylic acid ester is used, the hydrophobicity of the carboxylic acid film formed on the surface of the copper powder will be impaired and a preferred dispersion state of copper powder cannot be achieved during the formation of a paint or film in combination with binder resins.

The part of the ester corresponding to an alcohol comprises an alkoxy group having 1 to 10 carbon atoms, preferably 1 to 5 carbon atoms.

Separation and purification of the synthesized carboxylic acid ester can be carried out with techniques such as distillation, extraction, recrystallization, and column chromatography.

PROCESS FOR PRODUCING A COPPER POWDER FOR CONDUCTIVE PAINT

The process according to this invention comprises adding to a dispersion bath of copper powder and a dispersing medium a mixture of a titanium acylate polymer and a higher carboxylic acid ester to form a film of the titanium acylate polymer and of the higher carboxylic acid ester on the surfaces of the copper powder particles and removing according to necessity the dispersing medium to obtain the copper powder for conductive paint.

In the dispersion bath of the copper powder in this process, the copper powder particles to be coated form a good dispersion state by means of a dispersing medium. The dispersing medium in this case is, for example, water or an organic solvent such as an alcohol. Preferred dispersing mediums are water, methyl alcohol, ethyl alcohol, toluene, hexane and the like. The amount of the dispersing medium is that necessary for forming the preferred dispersion state of the copper powder and is preferably the minimal amount. If the amount of the dispersing medium increases, the reaction rate between the mixture of the titanium acylate polymer and the higher carboxylic acid ester and the surfaces of the copper powder particles is lowered, whereby it becomes difficult to obtain the desired copper powder.

The mixture of the titanium acylate polymer and higher carboxylic acid ester to be added can be obtained by mixing certain amounts of the two, and it can also be obtained from the reaction mixture of a tetraalkoxytitanium and a higher carboxylic acid.

The mixing ratio of the titanium acylate polymer and the higher carboxylic acid ester in this mixture is 5 to 95% by weight of the titanium acylate polymer to 95 to 5% by weight of the higher carboxylic acid ester, preferably 40 to 80% by weight of the titanium acylate polymer to 60 to 20% by weight of the higher carboxylic acid ester, more preferably 40 to 60% by weight of the titaniumn acylate polymer to 60 to 40% by weight of the higher carboxylic acid ester. If the amount of the titanium acylate polymer is less than the above range, hydrophobicity will be extremely inferior, and if the amount of the titanium acylate polymer exceeds the upper limit, conductivity will be gradually decreased. Also, if the amount of the higher carboxylic acid ester is less than the lower limit, dispersibility of the copper powder during the formation of the paint and film will be extremely poor.

The mixture of the titanium acylate polymer and the higher carboxylic acid ester can be diluted with, for example, organic solvents. Organic solvents which can be used in this case are preferably non-polar solvents such as toluene and hexane and polar solvents such as alcohols and acetone.

In order to obtain the mixture of the titanium acylate polymer and the higher carboxylic acid ester from the reaction mixture of a tetraalkoxytitanium and a higher carboxylic acid, the mixture is obtained from 1 mole of the tetraalkoxytitanium and 2-5 moles of the higher carboxylic acid, preferably from 1 mole of the tetraalkoxytitanium and 3-4 moles of the higher carboxylic acid. If the ratio is less than the lower limit, a simple acylate such as a monoacylate or a titanium alkoxypolymer will be produced, but no titanium acylate polymer will be produced. On the other hand, if the ratio is greater than the upper limit, the titanium acylate polymer will be produced quantitatively but such by-products as carboxylic esters or alcohols are also produced excessively. The alkoxy group of the tetraalkoxytitanium used in this process has 1 to 10, preferably 1 to 5 carbon atoms. If the number or the carbon atoms exceeds 5, hydrolysis of the compound with adsorption water on the surfaces of the copper powder particles may not proceed rapidly, or the reactivity with the carboxylic acid for forming an acylate will be decreased. If the number exceeds 10, the reactivity decreases extremely to such a level that almost no reaction will occur.

The mixture of the titanium acylate polymer and the higher carboxylic acid ester is used in a proportion of 0.05 to 15% by weight, preferably 0.1 to 10% by weight, more preferably 0.1 to 5% by weight relative to the copper powder. If the mixture is used in an amount less than 0.1% by weight, the surfaces of the copper powder particles will be insufficiently coated, whereby the copper powder particles will tend to agglomerate with each other, and the conductivity and shielding effect of the paint film will be very poor. On the other hand, if the amount exceeds 15% by weight, an excessive amount of the paint film will be formed, and good conductivity and shielding effect cannot be obtained.

The mixture of the titanium acylate polymer and the higher carboxylic acid ester is added to the dispersion bath of the copper powder directly in small portions or after dilution thereof with an organic solvent or water. Operation parameters such as addition rate and agitating time after addition are desirably selected according to the surface state of the copper powder, that is, the amount of adsorbed water, specific surface area, shapes of the copper powder particles and the like.

After the film of the titanium acylate polymer and the higher carboxylic acid ester has been formed, the dispersing solvent is removed, if necessary. This is because, if the drying is insufficient, good conductivity or shielding effect cannot be obtained because of the oxidation of the copper powder, and verdigris may be generated.

The copper powder thus obtained according to this invention can be mixed with a binder resin and a solvent to form a conductive paint composition. In addition to the above components, a variety of additives can be added depending on the intended use.

EXAMPLES

This invention will now be described more fully with respect to the following examples, which are presented as illustrative only.

EXPERIMENTAL MATERIALS a. Surface coating agent

A titanium acylate polymer (referred to hereinafter as TAP1) obtained from 1 mole of tetraisopropyltitanium and 3 moles of isostearic acid and isopropyl isostearate (referred to hereinafter as ISA) were mixed in proportions as shown in Table 1 to form surface coating agents according to this invention.

TABLE 1

| Surface coating agent | TAP1 (wt %) | ISA (wt %) |
|---|---|---|
| 1-1 | 50 | 50 |
| 1-2 | 40 | 60 |
| 1-3 | 60 | 40 |
| 1-4 | 70 | 30 |
| 1-5 | 90 | 10 |
| 1-6 | 30 | 70 |

A titanium acylate polymer (referred to hereinafter as TAP2) obtained from 1 mole of tetraisopropyltitanium and 3 moles of palmitic acid and isopropyl palmitate (referred to hereinaftrer as PAI) were mixed in proportions as shown in Table 2 to form surface coating agents according to this invention.

TABLE 2

| Surface coating agent | TAP2 (wt %) | PAI (wt %) |
|---|---|---|
| 2-1 | 50 | 50 |
| 2-2 | 40 | 60 |
| 2-3 | 60 | 40 |
| 2-4 | 70 | 30 |
| 2-5 | 90 | 10 |
| 2-6 | 30 | 70 |

For comparison, surface coating agents shown in Table 3 were also used.

TABLE 3

| No. | Surface coating agent |
|---|---|
| 3-1 | Isopropyltridodecylbenzenesulfonyltitanate |
| 3-2 | Isopropyltris(dioctylpyrophosphate)titanate |
| 3-3 | Bis(dioctylpyrophosphate)oxyacetatetitanate |
| 3-4 | Tetraisopropylbis(dioctylphosphate)titanate |
| 3-5 | Isopropyltricumylphenyltitanate |
| 3-6 | Isopropyltri(dioctylphosphate)titanate |
| 3-7 | Bis(dioctylpyrophosphate)ethylenetitanate |
| 3-8 | γ-methacryloxypropyltrimethoxysilane |

TABLE 3-continued

| No. | Surface coating agent |
|---|---|
| 3-9 | γ-glycidoxypropyltrimethoxysilane |
| 3-10 | γ-aminopropyltriethoxysilane |
| 3-11 | Acetoalkoxyaluminum diisopropylate | b. Copper Powder

A branch-shaped electrolytic copper powder specified in Table 4 and a flake copper powder as specified in Table 5 which had been obtained from spherical atomized copper powder by mechanical processing in a ball mill were used.

TABLE 4

| Apparent density | 0.8–1.1 g/cm$^3$ |
|---|---|
| Specific surface area | 0.40 m$^2$/g |
| Purity | 99.2% or more |
| Insolubles in HNO$_3$ | less than 0.03% |
| Reduced weight by reduction | less than 0.80% |
| Mean particle diameter | 8.0 μm |

TABLE 5

| Apparent density | 0.4–0.7 g/cm$^3$ |
|---|---|
| Specific surface area | 1.20 m$^2$/g |
| Purity | 99.7% or more |
| Mean particle diameter | 7.0 μm |

EXPERIMENTAL EXAMPLE 1. RUST PREVENTING EFFECT

Copper powders shown in Tables 4 and 5 were respectively dispersed in toluene solvent by agitation, and were treated by adding surface coating agents as shown in Tables 1, 2, and 3 in small portions to the copper powder dispersed solutions. After drying the copper powders, their heat resistance and humidity resistance were evaluated by leaving them to stand for 1,350 hrs at a temperature of 85° C. or in an environment of 45° C./95% RH. In these tests, the surface coating agents were used respectively in amounts of 0.05, 0.1, 0.5, 1.0, 3.0, 5.0, 10.0 and 10.5% by weight.

As a result, the copper powders according to this invention which had been treated with the surface coating agents 1-1, 1-2, 1-3, 2-1, 2-2 and 2-3 in amounts of 0.1–10.5% by weight exhibited no change, and verdigris was not generated. Copper powders which had been treated with the surface coating agents 1-4, 1-5, 1-6, 2-4, 2-5 and 2-6 in amounts of 1.0–10.5% by weight became dark brown, but no generation of verdigris was observed. On the other hand, copper powders which had been treated with the surface coating agents as shown in Table 3 acquired a dark brown color with generation of verdigris. From these results, it is apparent that the copper powders according to this invention form dense hydrophobic films and thus have excellent rust preventing effect and environmental resistance.

EXPERIMENTAL EXAMPLE 2. VOLUME RESISTIVITY

The surface coated copper powders used in Experimental Example 1 were respectively agitated with 45% by weight of an acrylic resin (solid content, 60% by weight) based on the weight of the respective copper powder and with a solvent (toluene) for 10 min. by a homomixer to prepare conductive paints. Each of the obtained conductive paints were formed into a circuit on an acrylate resin plate by the screen printing and dried in an atmosphere at 40° C. for 30 min. Volume resistivity of each circuit was measured.

It can be seen from the results that the conductive paints obtained from the copper powders according to this invention have volume resistivities of about $8 \times 10^{-4}$ to $1 \times 10^{-3}$ Ω·cm and thus have desirable conductivities and that they will not impair the conductivity.

EXPERIMENTAL EXAMPLE 3. ENVIRONMENTAL RESISTANCE OF PAINT FILM

A conductor circuit was formed on an acrylate resin plate as described in Experimental Example 2, and heat resistance and humidity resistance were evaluated by respectively leaving the circuit to stand at 85° C., 40° C./95% RH for 1,350 hrs and measuring the rate of change in resistance (%). The surface coating agents used in this experiment were 1-1, 1-2, 1-3, 2-1, 3-1~11.

As a result, most of the circuits obtained from the copper powders which had been treated with the surface coating agents 1-1, 1-2, 1-3 and 2-1, which were applied in amounts of 0.1–10.5% by weight, exhibited rates of change in resistance of ten and several percent, all of which were within the range of 7%–39%. On the other hand, when the surface coating agents for comparison of 3-1~11 were used, most of the circuits exhibited rates of chagne of 50 to 70%, some exceeding 100%.

From these results, it can be seen that the copper powder treated with the mixture of the titanium acylate polymer and the higher carboxylic acid ester also has excellent aging resistance superior to those of conventional metal organic compounds (titanium, silane or aluminum).

EXPERIMENTAL EXAMPLE 4. ENVIRONMENTAL RESISTANCE OF PAINT FILM

A conductor circuit was formed on an acrylate resin plate as described in Experimental Example 2, and environmental resistance was evaluated by a saline spraying test. The saline spraying test was carried out in accordance with JIS (Japanese Industrial Standard) specifications, in which 5% by weight aqueous saline solution was used for spraying, and 72 hours after spraying generation of verdigris was observed.

As a result, in non-treated copper powder, an extremely large amount of verdigris was observed on the whole surface of the paint film, and in the samples treated with the surface coating agents for comparison 3-1~11 verdigris was generated on about 50% of the paint film surface. On the other hand, in the case of the copper powders treated with the surface coating agents 1-1 to 1-6 and 2-1 to 2-6 which were applied in amounts of 0.1 to 10.5% by weight, generation of verdigris was not observed.

From these results, it can be seen that the copper powder treated with the mixture of the titanium acylate polymer and the higher carboxylic acid ester is also superior in durability over those treated with conventional metal organic compounds (titanium, silane or aluminum).

EXPERIMENTAL EXAMPLE 5. PULL STRENGTH

The conductive paints prepared in Experimental Example 2 were printed on acrylate substrates, polyester substrates, phenol substrates, glass-epoxy substrates, glass substrates, alumina-ceramics substrates by screen printing to form 2×2 mm pad films, which were subjected to a 90° pulling test. The test was carried out by affixing a 0.5-mm diameter tinned copper wire onto each paint film by using a cold setting epoxy resin. Each film had a thickness of 70±20 μm, and the amounts of the surface coating agent were 0, 0.5, 1.0, 5.0 and 10.5% by weight in proportion to the weight of the copper powder.

The following results were obtained.

ACRYLATE SUBSTRATES

While pull strength was 0.65 kg/mm$^2$ in the untreated samples, it was 0.8 to 1.0 kg/mm$^2$ in most of the samples treated with the surface coating agents 1-1 to 1-6 and 2-1 to 2-6, which were applied in amounts of 0.5 to 10.5% by weight and was 0.5 to 0.6 kg/mm$^2$ in most of the samples for comparison 3-1 to 3-11 regardless of the amounts of the surface coating agents.

POLYESTER SUBSTRATES

While pull strength was 0.58 kg/mm$^2$ in the untreated samples, it was 0.8 to 1.0 kg/mm$^2$ in most of the samples treated with the surface coating agents 1-1 to 1-6 and 2-1 to 2-6, which were applied in amounts of 0.5 to 10.5% by weight and was 0.5 to 0.6 kg/mm$^2$ in most of the samples for comparison 3-1 to 3-11 regardless of the amounts of the surface coating agents.

PHENOL SUBSTRATES

While pull strength was 0.60 kg/mm$^2$ in the untreated samples, it was 0.9 to 1.0 kg/mm$^2$ in most of the samples treated with the surface coating agents 1-1 to 1-6 and 2-1 to 2-6, which were applied in amounts of 0.5 to 10.5% by weight and was 0.5 to 0.6 kg/mm$^2$ in most of the samples for comparison 3-1 to 3-11 regardless of the amount of the surface coating agents.

GLASS-EPOXY SUBSTRATES

While pull strength was 0.48 kg/mm$^2$ in the untreated samples, it was 0.9 to 1.0 kg/mm$^2$ in most of the samples treated with the surface coating agents 1-1 to 1-6 and 2-1 to 2-6, which were applied in amounts of 0.5 to 10.5% by weight and was 0.5 to 0.6 kg/mm$^2$ in most of the samples for comparison 3-1 to 3-11 regardless of the amount of the surface coating agents.

GLASS SUBSTRATES

While pull strength was 0.38 kg/mm$^2$ in the untreated samples, it was 0.8 to 1.0 kg/mm$^2$ in most of the samples treated with the surface coating agents 1-1 to 1-6 and 2-1 to 2-6, which were applied in amounts of 0.5 to 10.5% by weight and was 0.5 to 0.6 kg/mm$^2$ in most of the samples for comparison 3-1 to 3-11 regardless of the amount of the surface coating agents.

ALUMINA-CERAMICS SUBSTRATES

While pull strength was 0.33 kg/mm$^2$ in the untreated samples, it was 0.8 to 1.1 kg/mm$^2$ in most of the samples treated with the surface coating agents 1-1 to 1-6 and 2-1 to 2-6, which were applied in amounts of 0.5 to 10.5% by weight and was 0.5 to 0.6 kg/mm$^2$ in most of the samples for comparison 3-1 to 3-11 regardless of the amount of the surface coating agents.

FIG. 1 is an electron micrograph (×700) of a section of a dry film of a conductive paint (2×2 mm pad) prepared with the copper powder treated with the mixture of the titanium acylate polymer and the higher carboxylic acid ester (surface treatment agents 1-1 to 1-6 and 2-1 to 2-6). It can be seen from the electron micrograph that the copper powder is homogeneously dispersed in the binder resin and that the substrate and the painted film are adhering strongly to each other.

Figure 2:
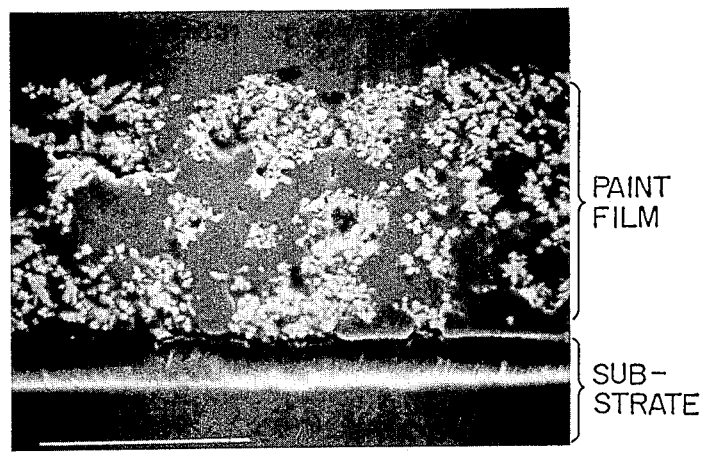

FIG. 2 is an electron micrograph (×700) of a section of a dry film of a conductive paint (2×2 mm pad) prepared with the copper powder which has been treated with the surface treatment agents 3-1 to 3-11. It can be seen from this electron micrograph that the copper powder is poorly dispersed in the binder resin and that the painted film is adhering weakly to the substrate because of unhomogeneous distribution of the copper powder.

EXPERIMENTAL EXAMPLE 6. PULL STRENGTH

Pull strength was evaluated as in Experimental Example 5 except that the following surface coating agents which contained no higher carboxylic ester were used.

Surface coating agent 4-1: titanium acylate polymer obtained from 1 mole of tetraisopropyltitanium and 3 moles of isostearic acid (referred to as TAP1), and Surface coating agent 4-2: titanium acylate polymer obtained from 1 mole of tetraisopropyltitanium and 3 moles of palmitic acid (referred to as TAP2).

In most of the experiments, pull strength remained at the level of 0.4 to 0.6 kg/mm$^2$.

It is to be noted from the results of Experimental Examples 5 and 6, the copper powders treated with the mixtures of the titanium acylate polymer and the higher carboxylic acid ester afford films which are far superior in adhesion to conventional metal organic compounds (titanium, silane or aluminum).

EXPERIMENTAL EXAMPLE 7. SHIELDING EFFECT

Conductive paints prepared in Experimental Example 2 were applied as coating on acrylate matrixes by spraying method, and the electromagnetic wave shielding effect of each film was evaluated at the initial stage and after aging of 1,350 hrs under a high temperature condition of 85° C. and high humidity condition of 40° C./95% RH by Advan test method.

The results were as follows.

Branch shaped copper powder, 500 MHz at initial stage: paint films obtained from the copper powder according to this invention (coating agent Nos. 1-1 to 1-6 and 2-1 to 2-6) exhibited shielding effects of 54 to 62 dB in the electric field, 52 to 64 dB in the magnetic field and 47 to 56 dB in the distant field. On the other hand, films for comparison (coating agent Nos. 3-1 to 1-11) exhibited only low levels of shielding effects of 40 to 50 dB in the electric field, 39 to 46 dB in the magnetic field and 34 to 41 dB in the distant field.

Flake shaped copper powder, 500 MHz, at an initial: paint films obtained from the copper powder according to this invention (coating agent Nos. 1-1 to 1-6 and 2-1 to 2-6) exhibited shielding effects of 45 to 58 dB in the electric field, 46 to 56 dB in the magnetic field and 41 to 52 dB in the distant field. On the other hand, films for comparison (coating agent Nos. 3-1 to 3-11) exhibited only low levels of shielding effects of 35 to 39 dB in the electric field, 31 to 37 dB in the magnetic field and 39 to 36 dB in the distant field.

Branch shaped copper powder, 500 MHz after being left standing for 1,350 hrs at a high temperature of 85°

C.: paint films obtained from the copper powder according to this invention (coating agent Nos. 1-1 to 1-6 and 2-1 to 2-6 exhibited shielding effects of 42 to 54 dB in the electric field, 41 to 54 dB in the magnetic field and 37 to 52 dB in the distant field. On the other hand, films for comparison (coating agent Nos. 3-1 to 3-11) exhibited shielding effects, which had been greatly lowered by aging to the level of 25 to 39 dB in the electric field, 25 to 34 dB in the magnetic field and 23 to 31 dB in the distant field.

Branch shaped copper powder, 500 MHz after being left standing for 1,350 hrs at a high humidity of 40° C./95% RH: paint films obtained from the copper powder according to this invention (coating agent Nos. 1-1 to 1-6 and 2-1 to 2-6) exhibited shielding effects of 44 to 58 dB in the electric field, 45 to 58 dB in the magnetic field and 40 to 57 dB in the distant field. On the other hand, films for comparison (coating agent Nos. 3-1 to 3-11) exhibited shielding effects which had been greatly lowered by aging to the level of 29 to 39 dB in the electric field, 29 to 34 dB in the magnetic field and 25 to 34 dB in the distant field.

Flake shaped copper powder, 500 MHz after being left standing for 1,350 hrs at a high temperature of 85° C.: paint films obtained from the copper powder according to this invention (coating agent Nos. 1-1 to 1-6 and 2-1 to 2-6) exhibited shielding effects of 40 to 49 dB in the electric field, 37 to 47 dB in the magnetic field and 34 to 45 dB in the distant field, and thus they had undergone almost no deterioration by aging. On the other hand, films for comparison (coating agent Nos. 3-1 to 3-11) exhibited shielding effects which had been extensively lowered by aging to the level of 19 to 25 dB in the electric field, 17 to 23 dB in the magnetic field and 17 to 22 dB in the distant field.

Flake shaped copper powder, 500 MHz after being left standing for 1,350 hrs at a high humidity of 40° C./95% RH: paint films obtained from the copper powder according to this invention (coating agent Nos. 1-1 to 1-6 and 2-1 to 2-6) exhibited shielding effects of 42 to 52 dB in the electric field, 41 to 52 dB in the magnetic field and 37 to 49 dB in the distant field, and thus they had undergone almost no deterioration by aging. On the other hand, films for comparison (coating agent Nos. 3-1 to 3-11) exhibited shielding effects which had been extensively lowered by aging to the level of 22 to 29 dB in the electric field, 21 to 28 dB in the magnetic field and 21 to 26 dB in the distant field.

It can be seen from the above results that the copper powder treated with the mixture of the titanium acylate polymer and the higher carboxylic acid ester affords a greatly improved shielding effect against electromagnetic waves as compared with conventional metal organic compounds (titanium, silane or aluminum).

What is claimed is:

1. A process for preparing a copper powder for electroconductive paints, which comprises adding to a dispersion bath of copper powder and a dispersion medium a mixture of effective amounts of a titanium acylate polymer and a higher carboxylic acid ester to form a film of said titanium acylate polymer and said higher carboxylic acid ester on the surfaces of the particles of said copper powder.

2. A process for preparing a copper powder for electroconductive paints according to claim 1 wherein the mixing ratio of the titanium acylate polymer and the higher carboxylic acid ester is 40 to 80% by weight of said titanium acylate polymer to 60 to 20% by weight of said higher carboxylic acid ester.

3. A process for preparing a copper powder for electroconductive paints according to claim 1 wherein said mixture of the titanium acylate polymer and the higher carboxylic acid ester is a reaction mixture of a tetraalkoxytitanium and a higher carboxylic acid.

4. A process for preparing a copper powder for electroconductive paints according to claim 3 wherein said tetraalkoxy titanium has alkyl groups having 1 to 10 carbon atoms.

5. A process for preparing a copper powder for electroconductive paints according to claim 1 wherein said mixture of said titanium acylate polymer and the higher carboxylic acid ester is a reaction mixture of 1 mole of said tetraalkoxy titanium and 2 to 5 moles of said higher carboxylic acid.

6. A process for preparing a copper powder for electroconductive paints according to claim 5 wherein said mixture of said titanium acylate polymer and the higher carboxylic acid ester is a reaction mixture of 1 mole of said tetraalkoxytitanium and 3 or 4 moles of said higher carboxylic acid.

7. A process for preparing a copper powder for electroconductive paints according to claim 1 wherein said dispersion medium is water or an organic solvent which can be easily removed.

8. A process for preparing a copper powder for electroconductive paints according to claim 1 wherein the application amount of said mixture of said titanium acylate polymer and said higher carboxylic acid ester to be added to the dispersion bath of the copper powder is 0.1 to 10% by weight to the amount of said copper powder.

9. A process for preparing a copper powder for electroconductive paints according to claim 1 wherein any existing oxide film has been removed from the surfaces of the copper powder particles to be coated.

10. A process according to claim 1 including the additional step of removing the dispersion medium to obtain said copper powder for electroconductive paints.

* * * * *